(12) United States Patent
Baumann et al.

(10) Patent No.: US 10,845,431 B2
(45) Date of Patent: Nov. 24, 2020

(54) HALL SENSOR

(71) Applicant: TDK-Micronas GmbH, Freiburg im Breisgau (DE)

(72) Inventors: Marc Baumann, Freiburg (DE); David Muthers, Denzlingen (DE); Thomas Desel, Freiburg (DE)

(73) Assignee: TDK-Micronas GmbH, Freiburg im Breisgau (DE)

( * ) Notice: Subject to any disclaimer, the term of this patent is extended or adjusted under 35 U.S.C. 154(b) by 0 days.

(21) Appl. No.: 16/503,789

(22) Filed: Jul. 5, 2019

(65) Prior Publication Data

US 2020/0025836 A1 Jan. 23, 2020

(30) Foreign Application Priority Data

Jul. 19, 2018 (DE) ........................ 10 2018 005 677

(51) Int. Cl.
*G01R 33/00* (2006.01)
*G01R 33/07* (2006.01)

(52) U.S. Cl.
CPC ......... *G01R 33/0017* (2013.01); *G01R 33/07* (2013.01)

(58) Field of Classification Search
None
See application file for complete search history.

(56) References Cited

U.S. PATENT DOCUMENTS

| | | | | |
|---|---|---|---|---|
| 5,406,202 A * | 4/1995 | Mehrgardt | ............. | G01R 33/07 324/251 |
| 6,025,683 A * | 2/2000 | Philipp | ................ | H02P 7/2913 318/139 |
| 6,927,572 B2 | 8/2005 | Motz | | |
| 2003/0173927 A1 * | 9/2003 | Hsu | ........................... | H02P 6/08 318/635 |
| 2003/0205996 A1 * | 11/2003 | Hara | ...................... | G01R 33/07 324/117 R |
| 2012/0280681 A1 * | 11/2012 | David | ................ | G01R 33/0029 324/251 |
| 2014/0194712 A1 * | 7/2014 | Hu | ..................... | A61B 5/14552 600/340 |

* cited by examiner

*Primary Examiner* — Nasima Monsur
(74) *Attorney, Agent, or Firm* — The Webb Law Firm

(57) ABSTRACT

A Hall sensor has a Hall sensor element, having multiple connection locations and a current supply source or voltage supply source, which has a first and a second supply connector for output of a supply current or a supply voltage. The first supply connector is connected or can be connected with a first connection location to feed a current into the Hall sensor element, and the second supply connector is connected or can be connected with a second connection location of the Hall sensor element. The Hall sensor has a NAND gate, which is connected with the first connection location of the Hall sensor element using a first input, and with the second connection location of the Hall sensor element using a second input, and has an output for output of a first error signal. Alternatively or in addition to the NAND gate, the Hall sensor can have a NOR gate, which is connected with the third connection location using a first input connector, and with the fourth connection location using a second input connector, and has an output connector for output of a second error signal.

20 Claims, 4 Drawing Sheets

| Error | | | | Measured voltage value | | | | Evaluation | | |
|---|---|---|---|---|---|---|---|---|---|---|
| C1 | C4 | C2 | C3 | C1 | C4 | C2 | C3 | Err1 | Err2 | Err |
| ground short-circuit | - | - | - | $V_B$ | $V_B/2$ | ground | $V_B/2$ | 0 | 0 | 0 |
| $V_B$ is absent | - | - | - | ground | ground | ground | ground | 0 | 1 | 1 |
| - | ground short-circuit | - | - | ground | ground | ground | ground | 0 | 1 | 1 |
| - | short-circuit with $V_B$ | - | - | $V_B$ | ground | ground | $V_B/2$ | 0 | 0 | 0 |
| - | - | short-circuit with $V_B$ | - | $V_B$ | $V_B$ | ground | $V_B/2$ | 0 | 0 | 0 |
| - | - | line break | - | $V_B$ | $V_B$ | $V_B$ | $V_B$ | 1 | 0 | 1 |
| - | - | - | ground short-circuit | $V_B$ | $V_B$ | $V_B$ | $V_B$ | 1 | 0 | 1 |
| - | - | - | short-circuit with $V_B$ | $V_B$ | $V_B/2$ | ground | ground | 0 | 0 | 0 |
| - | - | - | - | $V_B$ | $V_B/2$ | ground | $V_B$ | 0 | 0 | 0 |

Fig. 3

| Error | | | | Measured voltage value | | | | Evaluation | | | |
|---|---|---|---|---|---|---|---|---|---|---|---|
| C1 | C4 | C2 | C3 | C1 | C4 | C2 | C3 | Err1 | Err2 | Err3 | Err |
| ground short-circuit | - | - | - | $V_B$ | $V_B/2$ | ground | $V_B/2$ | 0 | 0 | 0 | 0 |
| $V_B$ is absent | - | - | - | ground | ground | ground | ground | 0 | 1 | 0 | 1 |
| - | ground short-circuit | - | - | $V_B$ | ground | ground | ground | 0 | 1 | 0 | 1 |
| - | short-circuit with $V_B$ | - | - | $V_B$ | $V_B$ | ground | $V_B/2$ | 0 | 0 | 1 | 0 |
| - | - | short-circuit with $V_B$ | - | $V_B$ | $V_B$ | ground | $V_B/2$ | 0 | 0 | 0 | 0 |
| - | - | line break | - | $V_B$ | $V_B$ | $V_B$ | $V_B$ | 1 | 0 | 0 | 1 |
| - | - | - | - | $V_B$ | $V_B$ | $V_B$ | $V_B$ | 1 | 0 | 0 | 1 |
| - | - | - | ground short-circuit | $V_B$ | $V_B/2$ | ground | ground | 0 | 0 | 1 | 0 |
| - | - | - | short-circuit with $V_B$ | $V_B$ | $V_B/2$ | ground | $V_B$ | 0 | 0 | 0 | 0 |

Fig. 5

# HALL SENSOR

CROSS-REFERENCE TO RELATED APPLICATION

This application claims priority to German Patent Application No. 10 2018 005 677.6 filed Jul. 19, 2018, the disclosure of which is hereby incorporated by reference in its entirety.

BACKGROUND OF THE INVENTION

Field of the Invention

The invention relates to a Hall sensor having a Hall sensor element, which has multiple connection locations spaced apart from one another, having a current supply source or voltage supply source, which has a first and a second supply connector for output of a supply current or a supply voltage, wherein the first supply connector for feeding a current into the Hall sensor element is connected or can be connected with a first connection location of the Hall sensor element, and the second supply connector is connected or can be connected with a second connection location of the Hall sensor element.

Description of Related Art

Such a Hall sensor is known from DE 102 04 427 B4. It has an approximately plate-shaped Hall sensor element, which has multiple connection locations at its edge, which are spaced apart from one another in the circumference direction. The connection locations are offset at regular angle distances with reference to a center, in such a manner that two connection locations, in each instance, lie diametrically opposite one another. When an exciter current is fed into the Hall sensor element by means of connecting two connection locations that lie diametrically opposite one another, with the supply connectors of a current supply source or voltage supply source, and the Hall sensor element has a magnetic flow density passing through it transverse to its plate plane, the Lorentz force acts on the moving electrons of the current, which force deflects the electrons transverse to their movement direction in the plate plane. As a result, an electrical field builds up in the Hall sensor element, transverse to the current direction, which field can be tapped as an electrical voltage between the connection locations that are not connected with the supply connectors. This voltage is called a Hall voltage.

In practical use of Hall sensors, however, the Hall voltage has an undesirable offset voltage superimposed on it. Hall sensor elements are generally produced as integrated circuits, together with the supply source and electronics for signal processing, and are mounted on a chip carrier and in a housing made of plastic. Due to production tolerances and during assembly, mechanical stresses can occur in the semiconductor crystal, which stresses can cause the offset voltage.

For compensation of the offset voltages, what is called the spinning Hall principle is used in the case of the Hall sensor known from DE 102 04 427 B4. In this regard, the exciter current is passed through the Hall sensor element in different directions, and the mean value is formed by way of the measured voltages.

Although the Hall sensor known from DE 102 04 427 B4 has proven itself in a great number of applications in practice, it nevertheless requires improvement. Thus, due to the constantly increasing number of Hall sensors installed in motor vehicles, for example, the demands on reliability of the Hall sensors have increased. This is because failure of only a single Hall sensor can already lead to malfunction of the vehicle, if the error is not recognized and compensated by means of corresponding measures, if necessary.

For this reason, the task exists of creating a Hall sensor of the type stated initially, which sensor makes it possible, in a simple manner, to detect possible errors that occur during operation of the Hall sensor and to display them.

SUMMARY OF THE INVENTION

The invention provides a Hall sensor with a NAND gate, which is connected, using a first input, with the first connection location of the Hall sensor element, and, using a second input, with the second connection location of the Hall sensor element, and has an output for outputting a first error signal, and/or that the Hall sensor has a NOR gate, which is connected, using a first input connector, with the third connection location, and, using a second input connector, with the fourth connection location, and has an output connector for outputting a second error signal.

The inputs of the NAND gate are therefore connected with the connection locations of the Hall sensor element at which the supply source is connected. During proper functioning of the Hall sensor, one of these connection locations must lie at the supply voltage, and the other one must lie at ground. If, however, the first and the second connection location lie at the potential of the supply voltage at the same time, a voltage is applied to both inputs of the NAND gate, in each instance, which is assigned to the logical value "1". Thereby a voltage is applied to the output of the NAND gate, which corresponds to the logical value "0". This value indicates that an impermissible operating state is present.

Alternatively or in addition to the NAND gate, the Hall sensor can have a NOR gate, which is connected, using its inputs, with the connection locations of the Hall sensor element, with which locations the supply source is not connected. Since the Hall sensor element behaves approximately like a Wheatstone bridge, in the case of a symmetrical configuration of the Hall sensor element, half of the supply voltage that is applied between the first and second connection location is applied at the third and fourth connection location, in each instance, against ground, if no Hall voltage and no offset voltages are present. As a result, in the case of proper functioning of the Hall sensor, a voltage is applied at the third and fourth connection location, in each instance, which is assigned to the logical value "1". Due to the inverting function of the NOR gate, in the case of proper functioning of the Hall sensor, a voltage is output at the output connector of the NOR gate, which voltage corresponds to the logical value "0". This value indicates that the NOR gate has not detected an error state.

During practical operation, the voltages at these connection locations can deviate slightly from these values due to the Hall voltage and the offset voltages. However, these deviations are so slight that they do not influence assignment of the voltages applied at the third and fourth connection locations of the Hall sensor to the logical values "0" or "1".

If no voltage is applied, due to an error both at the third and at the fourth connection location of the Hall sensor, or if a voltage is applied that is assigned to the logical value "0", a voltage is output at the output connector of the NOR gate, which corresponds to the logical value "1". The second error signal, which is applied to the output connector of the NOR gate, can therefore be utilized as a non-inverting error signal.

In an advantageous embodiment of the invention, the NAND gate has a third input, which is connected with the third connection location of the Hall sensor element. The first error signal then indicates if a potential is applied at the first, second, and third connection location of the Hall sensor element, in each instance, which potential is assigned to the logical value "0", in particular the ground potential. This corresponds to an impermissible operating state of the Hall sensor.

In a further development of the invention, the NOR gate has a third input connector, which is connected with the first connection location of the Hall sensor element. By way of the third input, absence of the supply voltage at the first connection location can be detected, if, at the same time, no voltage against ground is applied at the second and fourth connection location either.

In a practical embodiment of the invention, the NAND gate has a fourth input, which is connected with the fourth connection location of the Hall sensor element. The first error signal then indicates if a potential is applied at all four connection locations of the Hall sensor element, which potential is assigned to the logical value "0", in particular the ground potential. This corresponds to an impermissible operating state of the Hall sensor.

In a preferred further development of the invention, it is provided that the Hall sensor has a number of multiplexers that at least corresponds to the number of connection locations of the Hall sensor element, that in each instance, each multiplexer has a first multiplexer input connected with the first supply connector, a second multiplexer input connected with the second supply connector, and a multiplexer output that is connected with the connection location of the Hall sensor element assigned to the respective multiplexer, that each multiplexer has a control input, in each instance, to which a control signal can be applied, as a function of which one of the multiplexer inputs, in each instance, can be connected with the multiplexer output of the respective multiplexer, using an exciter current, to flow through the Hall sensor element, and that the control inputs of the multiplexers stand in a control connection with a control device, in such a manner that the exciter current can be passed through the Hall sensor element in different directions, one after the other. The Hall sensor can then be operated for compensation of undesirable offset voltages superimposed on the Hall voltage, in accordance with the spinning Hall principle.

It is advantageous if the Hall sensor has a multiplexer element that has a first multiplexer input connected with the first connection location, a second multiplexer input connected with the second connection location, a third multiplexer input connected with the third connection location, a fourth multiplexer input connected with the fourth connection location, and a multiplexer output, that the multiplexer element has a control input to which a control signal can be applied, as a function of which signal one of the multiplexer inputs, in each instance, can be connected with the multiplexer output of the multiplexer element, that the control inputs of the multiplexers and of the multiplexer element stand in a control connection with the control device, in such a manner that the multiplexer output of the multiplexer element is connected with a connection location of the Hall sensor element, in each instance, which is not connected with a supply connector of the current supply source or voltage supply source. In this regard, the multiplexer output can be used for output of a third error signal, which indicates if an error has occurred during operation of the Hall sensor according to the spinning Hall principle, for example if the control device does not output a control signal to the control inputs of the multiplexers or if the control signal is not passed on or is not passed on correctly between the individual current application phases.

It is advantageous if the output of the NAND gate is connected with an inverting first input of an OR gate and the output connector of the NOR gate is connected with a non-inverting second input of the OR gate, and if the OR gate has an output for output of a fourth error signal. The third error signal is active, in this case, when either a voltage assigned to the logical value "0" (for example ground potential) or a voltage assigned to the logical value "1" (for example the supply voltage) is applied at all connection locations of the Hall sensor element.

If necessary, the multiplexer output of the multiplexer element can be connected with a third input of the OR gate. In this regard, the third input can also be an inverting input, which is indirectly connected with the multiplexer output by way of an additional inverter. The fourth error signal then also indicates a possible failure of the spinning Hall operation of the Hall sensor.

It should also be mentioned that in the case of the Hall sensor according to the invention, the Hall sensor element can be configured as a vertical Hall sensor element or as a horizontal Hall sensor element. A vertical Hall sensor element is understood to be a Hall sensor element that is sensitive for magnetic flow densities that are disposed parallel to the chip surface of the semiconductor chip. A horizontal or lateral Hall sensor element is understood to be a Hall sensor element that is sensitive for magnetic flow densities that are disposed at a right angle to the chip surface of the semiconductor chip.

BRIEF DESCRIPTION OF THE DRAWINGS

In the following, exemplary embodiments of the invention are explained using the drawing. This shows.

DESCRIPTION OF THE INVENTION

Figure 1:
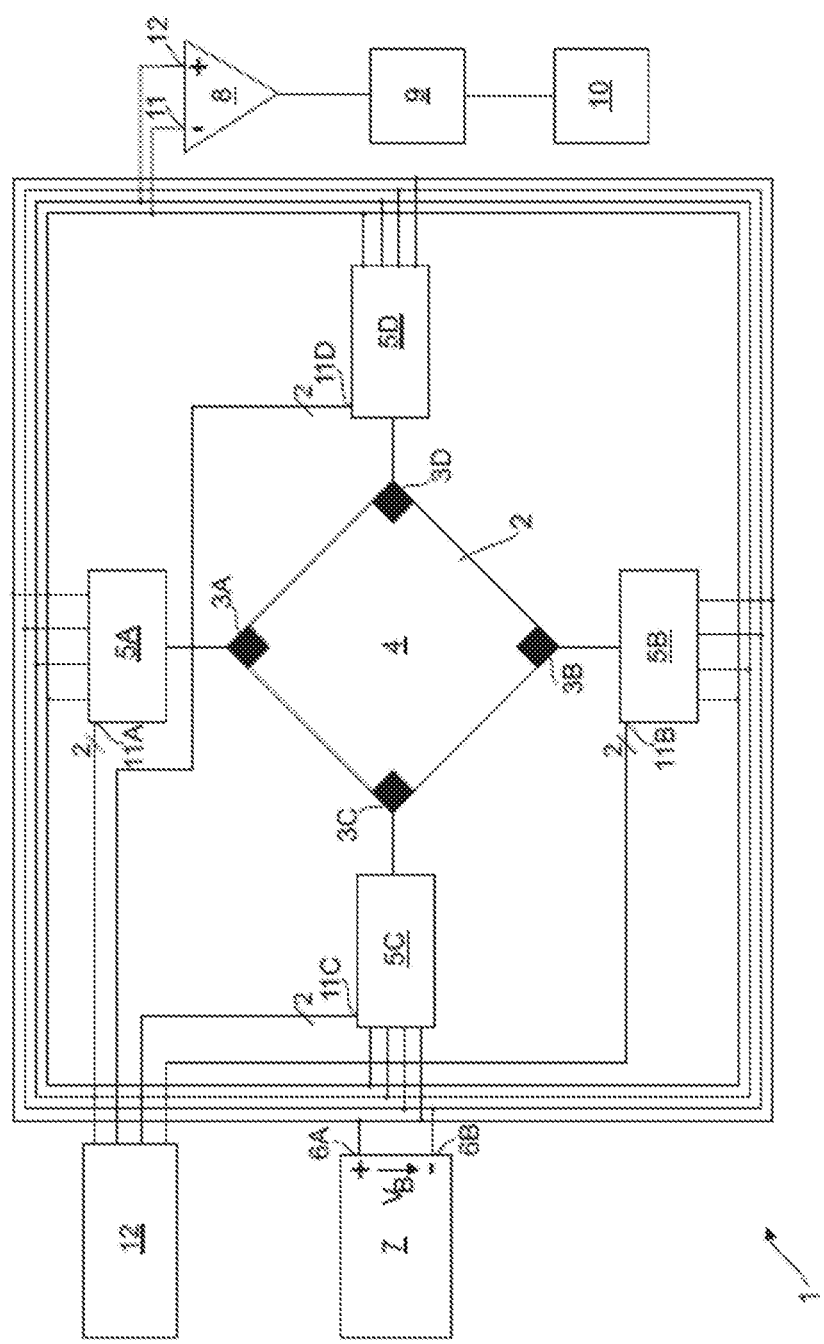
FIG. 1 a block schematic of a Hall sensor that works according to the spinning Hall principle, FIG. 2 a schematic representation of a monitoring device of a first exemplary embodiment of the Hall sensor, FIG. 3 a table in which the electrical voltages at the connection locations of a Hall sensor element and error signals for different error states of the first exemplary embodiment of the Hall sensor are listed, FIG. 4 a schematic representation of a monitoring device of a second exemplary embodiment of the Hall sensor, and FIG. 5 a table in which the electrical voltages at the connection locations of a Hall sensor element and error signals for different error states of the second exemplary embodiment of the Hall sensor are listed.

A Hall sensor indicated as a whole as 1 in FIG. 1 has a semiconductor chip into which a plate-shaped Hall sensor element 2 is integrated. The Hall sensor element 2 consists of a semiconductor material, such as silicon, for example, and has multiple connection locations 3A, 3B, 3C, 3D at its edge, spaced apart from one another, which are offset by 90° relative to one another with reference to an imaginary center axis that runs orthogonal to the plane spanned by the Hall sensor element 2, through a center of symmetry 4.

The connection locations 3A, 3B, 3C, 3D are connected with a switching device that has a multiplexer 5A, 5B, 5C, 5D for each connection location 3A, 3B, 3C, 3D, in each instance. An output connector of each multiplexer 5A, 5B, 5C, 5D is connected, in each instance, with a connection location 3A, 3B, 3C, 3D assigned to it. Each multiplexer 5A, 5B, 5C, 5D has two inputs, in each instance, which are connected with supply connectors 6A, 6B of a current supply source or voltage supply source 7. This supply voltage VB made available by the supply source 7 or this supply current made available by the supply source 7 serves for feeding an exciter current into the Hall sensor element 2.

In a first phase of current application, a first supply connector 6A is connected with the first connection location 3A of the Hall sensor element 2 by way of a first multiplexer 5A, and the second supply connector 6B is connected with a second connection location 3B of the Hall sensor element 2 by way of a second multiplexer 5B.

In a second phase of current application, the second supply connector 6B is connected with a third connection location 3C of the Hall sensor element 2 by way of a third multiplexer 5C, and the first supply connector 6A is connected with a fourth connection location 3D of the Hall sensor element 2 by way of a fourth multiplexer 5D.

In a third phase of current application, the first supply connector 6A is connected with the second connection location 3B of the Hall sensor element 2 by way of the second multiplexer 5B, and the second supply connector 6B is connected with the first connection location 3A of the Hall sensor element 2 by way of the first multiplexer 5A. The exciter current thereby flows in the opposite direction during the third phase as compared with the first phase.

In a fourth phase of current application, the first supply connector 6A is connected with the third connection location 3C of the Hall sensor element 2 by way of the third multiplexer 5C, and the second supply connector 6B is connected with a fourth connection location 3D of the Hall sensor element 2 by way of the fourth multiplexer 5D. The exciter current thereby flows in the opposite direction during the fourth phase as compared with the second phase.

Two further inputs of each multiplexer 5A, 5B, 5C, 5D are electrically connected with input connectors 11, 12 of a measurement device 8, which is provided for measuring the voltage between two diametrically opposite connection locations 3A, 3B and 3C, 3D. The measurement device 8 has a digital/analog converter, not shown in any detail in the drawing, for digitalization of the measured voltages, which converter is connected with a data memory 9 for storing measured values. The data memory 9 is connected with an evaluation device 10, in which the measured voltage values are processed, in known manner, so as to compensate offset voltages contained in them, which voltages are superimposed on the Hall voltages. During measurement of the Hall voltage, the Hall sensor element 2 has a magnetic flow density passing through it transverse to its expanse plane, which density is not shown in any detail in the drawing and can flow into the plane of the drawing of FIG. 1, for example.

The multiplexers 5A, 5B, 5C, 5D each have a control input 11A, 11B, 11C, 11D, which stands in a control connection with a common control device 12. The respective multiplexer 5A, 5B, 5C, 5D can be configured, in each instance, by means of transmission of a corresponding control signal to the control inputs 11A, 11B, 11C, 11D, in such a manner that the connection location 3A, 3B, 3C, 3D connected with the output connector of the multiplexer 5A, 5B, 5C, 5D is optionally or alternately electrically connected with one of the inputs of the first multiplexer 5A, 5B, 5C, 5D or separated from them. The multiplexers 5A, 5B, 5C, 5D are synchronized in such a manner that in every current application phase, two diametrically opposite connection locations 3A, 3B, 3C, 3D, in each instance, are connected with the supply source 7, and the two other connection locations 3A, 3B, 3C, 3D are connected with the measurement device 8.

Figure 2:
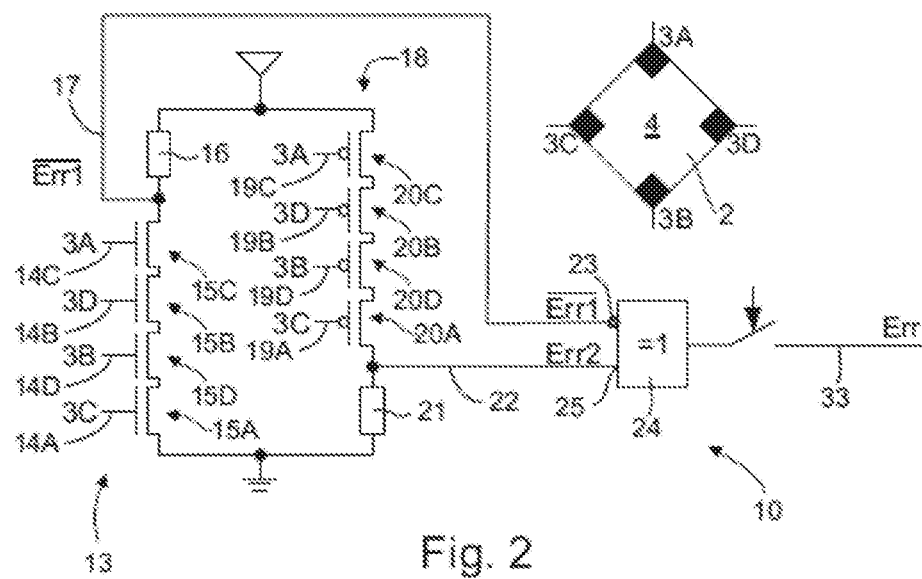

As can be seen in FIG. 2, the evaluation device 10 has a wired NAND gate 13, which is connected with the third connection location 3C using a first input 14A, with a fourth connection location 3D using a second input 14B, with the first connection location 3A using a third input 14C, and with the second connection location 3B of the Hall sensor element 2 using a fourth input 14D. An output of the NAND gate 13 serves for output of a first error signal/Err1.

As can furthermore be seen in FIG. 2, the NAND gate 13 has four N-channel field effect transistors 15A, 15B, 15C, 15D, which are switched in series with their source/drain segments and a pull-up resistor element 16. The first input 14A of the NAND gate 13 is connected with the gate contact of a first N-channel field effect transistor 15A, the second input 14B of the NAND gate 13 is connected with the gate contact of a second N-channel field effect transistor 15B, the third input 14C of the NAND gate 13 is connected with the gate contact of a third N-channel field effect transistor 15C, and the fourth input 14D of the NAND gate 13 is connected with the gate contact of a fourth N-channel field effect transistor 15D.

The drain contact of the third field effect transistor 15C is connected with a first connector of the pull-up resistor element 16, and the second connector of the pull-up resistor element 16 is connected with the first supply connector 6A of the supply source 7, which carries the supply voltage VB. The drain contact of the third field effect transistor 15C is furthermore connected with an output 17 of the NAND gate 13. The source contact of the third field effect transistor 15C is connected with the drain contact of the second field effect transistor 15B, the source contact of the second field effect transistor 15B is connected with the drain contact of the fourth field effect transistor 15D, and the source contact of the fourth field effect transistor 15D is connected with the drain contact of the first field effect transistor 15A. The source contact of the first field effect transistor 15A is connected with a ground connector.

If a voltage is applied at all inputs 14A, 14B, 14C, and 14D of the NAND gate 13, which voltage corresponds to the logical value "1", all the field effect transistors 15A, 15B, 15C, 15D are switched through. Then a current flows through the pull-up resistor element 16, which current brings about a voltage drop at the pull-up resistor element 16, which drop lowers the potential at the output 17 of the NAND gate to a value that corresponds to the logical value "0". This value indicates that an error is present in the Hall sensor 1 (FIG. 3).

If a voltage is applied at an input 14A, 14B, 14C, and 14D of the NAND gate 13, which voltage corresponds to the logical value "0", at least one field effect transistor 15A, 15B, 15C, 15D is blocked, and the current flow through the pull-up resistor element 16 is interrupted. The potential at the output 17 of the NAND gate then lies at a value that corresponds to the logical value "1". This value indicates that the NAND gate 13 has not detected an error in the Hall sensor 1.

As can furthermore be seen in FIG. 2, the evaluation device 10 furthermore has a wired NOR gate 18, which is connected with the third connection location 3C using a first input connector 19A, with the fourth connection location 3D using a second input connector 19B, with the first connection location 3A using a third input connector 19C, and with the second connection location 3B of the Hall sensor element 2 using a fourth input connector 19D. An output connector 22 of the NOR gate 18 serves for output of a second error signal Err2.

As can be seen in FIG. 2, the NOR gate 18 has four P-channel field effect transistors 20A, 20B, 20C, 20D, which are switched in series with their source-drain segments and a pull-down resistor element 21. The first input connector 19A of the NOR gate 18 is connected with the gate contact of a first P-channel field effect transistor 20A, the second input connector 19B of the NOR gate 18 is connected with the gate contact of a second P-channel field effect transistor 20B, the third input 19C of the NOR gate 18 is connected with the gate contact of a third P-channel field effect transistor 20C, and the fourth input 19D of the NOR gate 18 is connected with the gate contact of a fourth P-channel field effect transistor 20D.

The drain contact of the third P-channel field effect transistor 20C is connected with the first supply connector 6A of the supply source 7, which carries the supply voltage VB. The source contact of the third P-channel field effect transistor 20C is connected with the drain contact of the second P-channel field effect transistor 20B, the source contact of the second P-channel field effect transistor 20B is connected with the drain contact of the fourth P-channel field effect transistor 20D, and the source contact of the fourth field effect transistor 20D is connected with the drain contact of the first P-channel field effect transistor 20A. The source contact of the first P-channel field effect transistor 20A is connected with a first connector of the pull-down resistor element 21, and the second connector of the pull-down resistor element 21 is connected with the ground connector. The source contact of the first P-channel field effect transistor 20A is furthermore connected with the output connector 22 of the NOR gate 18.

If a voltage is applied to all the input connectors 19A, 19B, 19C, 19D of the NOR gate 18, which voltage corresponds to the logical value "0", all the P-channel field effect transistors 20A, 20B, 20C, 20D are switched through. Then a current flows through the pull-down resistor element 21, which current brings about a voltage drop at the pull-down resistor element 21, which drop sets the potential at the output connector 22 of the NOR gate at a value that corresponds to the logical value "1". This value indicates that an error is present in the Hall sensor 1 (FIG. 3).

If a voltage is applied to at least one input connector 19A, 19B, 19C, 19D of the NOR gate 18, which voltage does not correspond to the logical value "0", at least one of the P-channel field effect transistors 20A, 20B, 20C, 20D is blocked, and the current flow through the pull-down resistor element 21 is interrupted. The potential at the output connector 22 of the NOR gate 18 then lies at a value that corresponds to the logical value "0". This value indicates that the NOR gate 18 has not detected any error in the Hall sensor 1.

As can be seen in FIG. 2, the output 17 of the NAND gate 13 is connected with an inverting first input 23 of an OR gate 24. The output connector 22 of the NOR gate 18 is connected with a non-inverting second input 25 of an OR gate 24. An error signal Err that is present at the output 33 of the OR gate 24 is active if the NAND gate and/or the NOR gate has/have detected an error in the Hall sensor 1 (FIG. 3).

Figure 4:
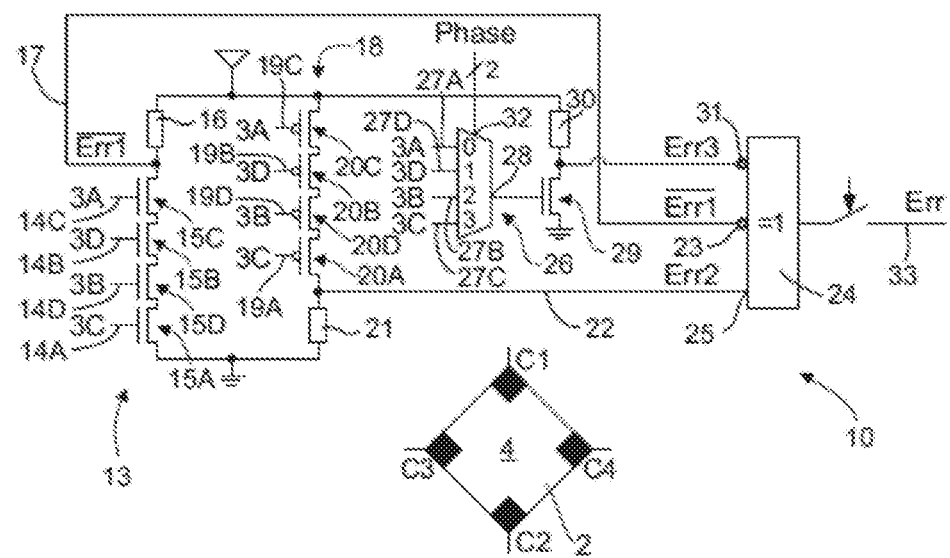

The exemplary embodiment shown in FIG. 4 corresponds to the exemplary embodiment from FIG. 2, but additionally has a device for detection of a spinning error. For this purpose, the evaluation device 10 has a multiplexer element 28, which has a first multiplexer input 27A connected with the first connection location 3A, a second multiplexer input 27B connected with the second connection location 3B, a third multiplexer input 27C connected with the third connection location 3C, a fourth multiplexer input 27D connected with the fourth connection location 3D, and a multiplexer output 28.

The multiplexer output 28 is connected with the gate of a switching element 29 structured as an N-channel field effect transistor, which element is connected with a first connector of a pull-up resistor 30 using its drain connector, and with an inverting third input 31 of the OR gate 24. A third error signal Err3 is applied to the third input 31 of the OR gate 24 by way of the drain connector. A second connector of the pull-up resistor 30 is connected with the first supply connector 6A of the supply source 7, which connector carries the supply voltage VB. The source connector of the transistor element 29 is connected with the ground connector.

The multiplexer element 26 furthermore has a control input 31 connected with the control device 12, to which input a control signal can be applied, as a function of which signal one of the multiplexer inputs 27A, 27B, 27C, 27D, in each instance, can be connected with the multiplexer output 28. The control input 32 of the multiplexer element 26 and the control inputs 11A, 11B, 11C, 11D of the multiplexers 5A, 5B, 5C, 5D stand in a control connection with the control device 12, in such a manner that the exciter current can be passed through the Hall sensor element 2 in different directions during the individual current application phases, and the multiplexer output 28 of the multiplexer element 26 is connected, in each instance, with a connection location 3C, 3D of the Hall sensor element 2, which location is not connected with a supply connector 6A, 6B of the supply source 7.

As can be seen in FIG. 5, the third error signal Err3 has the logical value "1" when a connection location 3C, 3D of the Hall sensor element 2, which is not connected with a supply connector 6A, 6B of the supply source, has a potential that is assigned to the logical value "0". Thereby the third error signal Err3 is active if the respective connection location of the Hall sensor element 2 lies at ground, in other words a spinning error is present. A spinning error can occur, for example, if the control device 12 does not output a control signal to the control inputs 11A, 11B, 11C, 11D, or the control signal is not passed on between the individual current application phases, or is not passed on correctly.

As can be seen in FIG. 5, the Hall sensor 1 can also be disrupted in that the supply voltage VB is present at a connection location 3C, 3D of the Hall sensor element 2 not connected with a supply connector 6A, 6B of the supply source, due to a short-circuit with the first supply connector 6A of the supply source 7. In the case of a Hall sensor in which the measured Hall voltage is digitalized using an analog/digital converter, this error can be detected in that the analog voltage and/or the digital signal obtained from it is compared with a value range provided for this purpose, and an error signal is generated if the corresponding signal lies outside of the value range.

The invention claimed is:

1. A Hall sensor having a Hall sensor element; which has multiple connection locations, including first, second, third, and fourth connection locations, spaced apart from one another, having a current supply source or voltage supply source, which has a first and a second supply connector for output of a supply current or a supply voltage, wherein the first supply connector is connected with the first connection location of the Hall sensor element to feed a current into the Hall sensor element, and the second supply connector is connected with the second connection location of the Hall sensor element, characterized in that the Hall sensor has a NAND gate, which is connected with the first connection location of the Hall sensor element using a first input, and with the second connection location of the Hall sensor element using a second input, and has an output for output of a first error signal, and that the Hall sensor has a NOR gate, which is connected with the third connection location using a first input connector, and with the fourth connection location using a second input connector, and has an output connector for output of a second error signal.

2. The Hall sensor according to claim 1, characterized in that the NAND gate has a third input, which is connected with the third connection location of the Hall sensor element.

3. The Hall sensor according to claim 1, characterized in that the NOR gate has a third input connector, which is connected with the first connection location of the Hall sensor element.

4. The Hall sensor according to claim 2, characterized in that the NAND gate has a fourth input, which is connected with the fourth connection location of the Hall sensor element.

5. The Hall sensor according to claim 3, characterized in that the NOR gate has a fourth input connector, which is connected with the second connection location of the Hall sensor element.

6. The Hall sensor according to claim 1, characterized in that the Hall sensor has at least a number of multiplexers corresponding to the number of connection locations of the Hall sensor element, that each multiplexer is connected, in each instance, with a first multiplexer input connected with the first supply connector, a second multiplexer input connected with the second supply connector, and a multiplexer output that is connected with a connection location of the Hall sensor element that is assigned to the respective multiplexer, that each multiplexer has a control input, in each instance, to which a control signal is applied, as a function of which signal one of the multiplexer inputs, in each instance, is connected with the multiplexer output of the respective multiplexer, for an exciter current to flow through the Hall sensor element, and that the control inputs of the multiplexers stand in a control connection with a control device, in such a manner that the exciter current is passed through the Hall sensor element in different directions, one after the other.

7. The Hall sensor according to claim 6, characterized in that the Hall sensor has a multiplexer element, which has a first multiplexer input connected with the first connection location, a second multiplexer input connected with the second connection location, a third multiplexer input connected with the third connection location, a fourth multiplexer input connected with the fourth connection location, and a multiplexer output, that the multiplexer element has a control input, to which a control signal is applied, as a function of which signal one of the multiplexer inputs, in each instance, is connected with the multiplexer output of the multiplexer element, that the control inputs of the multiplexers and of the multiplexer element stand in a control connection with the control device, in such a manner that the multiplexer output of the multiplexer element is connected, in each instance, with a connection location of the Hall sensor element, which location is not connected with a supply connector of the current supply source or voltage supply source.

8. The Hall sensor according to claim 7, characterized in that the output of the NAND gate is connected with an inverting first input of an OR gate, and the output connector of the NOR gate is connected with a non-inverting second input of the OR gate, and that the OR gate has an output for output of a third error signal.

9. The Hall sensor according to claim 8, characterized in that the multiplexer output of the multiplexer element is connected with a third input of the OR gate.

10. A Hall sensor having a Hall sensor element, which has multiple connection locations spaced apart from one another, having a current supply source or voltage supply source, which has a first and a second supply connector for output of a supply current or a supply voltage, wherein the first supply connector is connected with a first connection location of the Hall sensor element to feed a current into the Hall sensor element, and the second supply connector is connected with a second connection location of the Hall sensor element, characterized in that the Hall sensor has a NAND gate, which is connected with the first connection location of the Hall sensor element using a first input, and with the second connection location of the Hall sensor element using a second input, and has an output for output of a first error signal, characterized in that the Hall sensor has at least a number of multiplexers corresponding to the number of connection locations of the Hall sensor element, that each multiplexer is connected, in each instance, with a first multiplexer input connected with the first supply connector, a second multiplexer input connected with the second supply connector, and a multiplexer output that is connected with a connection location of the Hall sensor element that is assigned to the respective multiplexer, that each multiplexer has a control input, in each instance, to which a control signal is applied, as a function of which signal one of the multiplexer inputs, in each instance, is connected with the multiplexer output of the respective multiplexer, for an exciter current to flow through the Hall sensor element, and that the control inputs of the multiplexers stand in a control connection with a control device, in such a manner that the exciter current is passed through the Hall sensor element in different directions, one after the other.

11. The Hall sensor according to claim 10, characterized in that the NAND gate has a third input, which is connected with a third connection location of the Hall sensor element.

12. The Hall sensor according to claim 11, characterized in that the NAND gate has a fourth input, which is connected with a fourth connection location of the Hall sensor element.

13. The Hall sensor according to claim 10, characterized in that the Hall sensor has a multiplexer element, which has a first multiplexer input connected with the first connection location, a second multiplexer input connected with the second connection location, a third multiplexer input connected with a third connection location, a fourth multiplexer input connected with a fourth connection location, and a multiplexer output, that the multiplexer element has a control input, to which a control signal is applied, as a function of which signal one of the multiplexer inputs, in each instance, is connected with the multiplexer output of the multiplexer element, that the control inputs of the multiplexers and of the multiplexer element stand in a control connection with the control device, in such a manner that the multiplexer output of the multiplexer element is connected, in each instance, with a connection location of the Hall sensor element, which location is not connected with a supply connector of the current supply source or voltage supply source.

14. The Hall sensor according to claim 13, characterized in that the output of the NAND gate is connected with an inverting first input of an OR gate, and that the OR gate has an output for output of a second error signal.

15. The Hall sensor according to claim 14, characterized in that the multiplexer output of the multiplexer element is connected with a third input of the OR gate.

16. A Hall sensor having a Hall sensor element, which has multiple connection locations, including first, second, third, and fourth connection locations, spaced apart from one another, having a current supply source or voltage supply source, which has a first and a second supply connector for output of a supply current or a supply voltage,
wherein the first supply connector is connected with the first connection location of the Hall sensor element to feed a current into the Hall sensor element, and the second supply connector is connected with the second connection location of the Hall sensor element,
characterized in that the Hall sensor has a NOR gate, which is connected with the third connection location using a first input connector, and with the fourth connection location using a second input connector, and has an output connector for output of a first error signal;
wherein the NOR gate has a third input connector, which is connected with the first connection location of the Hall sensor element; and wherein
the NOR gate has a fourth input connector, which is connected with the second connection location of the Hall sensor element.

17. The Hall sensor according to claim 16, characterized in that the Hall sensor has at least a number of multiplexers corresponding to the number of connection locations of the Hall sensor element, that each multiplexer is connected, in each instance, with a first multiplexer input connected with the first supply connector, a second multiplexer input connected with the second supply connector, and a multiplexer output that is connected with a connection location of the Hall sensor element that is assigned to the respective multiplexer, that each multiplexer has a control input, in each instance, to which a control signal is applied, as a function of which signal one of the multiplexer inputs, in each instance, is connected with the multiplexer output of the respective multiplexer, for an exciter current to flow through the Hall sensor element, and that the control inputs of the multiplexers stand in a control connection with a control device, in such a manner that the exciter current is passed through the Hall sensor element in different directions, one after the other.

18. The Hall sensor according to claim 17, characterized in that the Hall sensor has a multiplexer element, which has a first multiplexer input connected with the first connection location, a second multiplexer input connected with the second connection location, a third multiplexer input connected with the third connection location, a fourth multiplexer input connected with the fourth connection location, and a multiplexer output, that the multiplexer element has a control input, to which a control signal is applied, as a function of which signal one of the multiplexer inputs, in each instance, is connected with the multiplexer output of the multiplexer element, that the control inputs of the multiplexers and of the multiplexer element stand in a control connection with the control device, in such a manner that the multiplexer output of the multiplexer element is connected, in each instance, with a connection location of the Hall sensor element, which location is not connected with a supply connector of the current supply source or voltage supply source.

19. The Hall sensor according to claim 18, characterized in that the output connector of the NOR gate is connected with a non-inverting second input of an OR gate, and that the OR gate has an output for output of a second error signal.

20. The Hall sensor according to claim 19, characterized in that the multiplexer output of the multiplexer element is connected with a third input of the OR gate.

* * * * *